United States Patent
Jeong

(10) Patent No.: US 8,694,927 B2
(45) Date of Patent: Apr. 8, 2014

(54) METHOD OF DESIGNING PATTERN LAYOUTS

(71) Applicant: Samsung Electronics Co., Ltd., Suwon-si (KR)

(72) Inventor: Moon-Gyu Jeong, Gwangmyeong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/670,993

(22) Filed: Nov. 7, 2012

(65) Prior Publication Data

US 2013/0263062 A1 Oct. 3, 2013

(30) Foreign Application Priority Data

Mar. 28, 2012 (KR) .................. 10-2012-0031772

(51) Int. Cl.
*G06F 17/50* (2006.01)
*G06F 19/00* (2011.01)
*G21K 5/00* (2006.01)
*G03F 1/00* (2012.01)
*G03F 1/26* (2012.01)
*G03F 1/38* (2012.01)
*G03F 1/36* (2012.01)
*G03F 1/70* (2012.01)
*G03F 1/72* (2012.01)

(52) U.S. Cl.
CPC .............. *G06F 17/5081* (2013.01); *G03F 1/26* (2013.01); *G03F 1/38* (2013.01); *G03F 1/36* (2013.01); *G03F 1/70* (2013.01); *G03F 1/72* (2013.01); *G21K 5/00* (2013.01); *G06F 19/00* (2013.01)

USPC .................. 716/53; 716/54; 716/52; 716/55; 716/112; 700/98; 700/110; 700/120; 700/121; 430/5; 378/35

(58) Field of Classification Search
CPC ....... G06F 17/5081; G06F 19/00; G03F 1/26; G03F 1/38; G03F 1/36; G03F 1/70; G03F 1/72; G21K 5/00
USPC ............ 716/53, 52, 54, 55, 112; 700/98, 110, 700/120, 121; 430/5; 378/35
See application file for complete search history.

(56) References Cited

U.S. PATENT DOCUMENTS

| | | | | |
|---|---|---|---|---|
| 5,812,412 | A * | 9/1998 | Moriizumi et al. | 716/55 |
| 6,457,157 | B1 * | 9/2002 | Singh et al. | 716/122 |
| 6,548,312 | B1 * | 4/2003 | Hayano et al. | 438/5 |
| 6,610,989 | B1 * | 8/2003 | Takahashi | 250/492.3 |
| 6,632,590 | B1 * | 10/2003 | Tzu et al. | 430/311 |
| 6,779,167 | B2 * | 8/2004 | Igarashi et al. | 257/774 |

(Continued)

FOREIGN PATENT DOCUMENTS

| | | |
|---|---|---|
| KR | 10-2008-0102650 A | 11/2008 |
| KR | 10-2009-0071735 A | 7/2009 |
| KR | 10-2009-0071736 A | 7/2009 |
| KR | 10-2009-0109351 A | 10/2009 |

*Primary Examiner* — Phallaka Kik
(74) *Attorney, Agent, or Firm* — Lee & Morse, P.C.

(57) ABSTRACT

A method of designing a pattern layout includes defining one shot area including a plurality of chip areas, generating an initial common layout in the plurality of chip areas, primarily correcting the initial layout to form a primary corrected layout, and secondarily correcting the primary corrected layout independently to form a plurality of secondary corrected layouts.

19 Claims, 20 Drawing Sheets

(56) References Cited

U.S. PATENT DOCUMENTS

| | | | |
|---|---|---|---|
| 6,800,421 B2* | 10/2004 | Hasegawa et al. | 430/311 |
| 7,904,852 B1* | 3/2011 | Cadouri et al. | 716/100 |
| 8,304,724 B2* | 11/2012 | Sasajima et al. | 250/310 |
| 2002/0076654 A1* | 6/2002 | Hasegawa et al. | 430/311 |
| 2002/0093635 A1* | 7/2002 | Oguri et al. | 355/53 |
| 2002/0157068 A1* | 10/2002 | LaCour et al. | 716/3 |
| 2004/0248043 A1* | 12/2004 | Shiraishi | 430/311 |
| 2005/0044522 A1* | 2/2005 | Maeda | 716/18 |
| 2005/0093110 A1* | 5/2005 | Smith et al. | 257/660 |
| 2005/0277029 A1* | 12/2005 | Sasajima et al. | 430/4 |
| 2006/0073686 A1* | 4/2006 | Zach et al. | 438/551 |
| 2008/0116398 A1* | 5/2008 | Hara et al. | 250/492.22 |
| 2008/0141212 A1* | 6/2008 | Haffner | 716/21 |
| 2009/0031261 A1* | 1/2009 | Smith et al. | 716/2 |
| 2009/0031278 A1* | 1/2009 | McElvain et al. | 716/18 |
| 2009/0115982 A1* | 5/2009 | Kanaya | 355/53 |
| 2010/0287521 A1* | 11/2010 | Sahouria et al. | 716/55 |
| 2012/0181669 A1* | 7/2012 | Lin et al. | 257/620 |
| 2012/0273841 A1* | 11/2012 | Quandt et al. | 257/208 |

* cited by examiner (A)  (B)

(A)          (B)

(A)          (B)

(A)    (B)

(A)    (B)

(A)            (B)

(A)            (B)

(A)  (B)

(A)  (B)

(A)            (B)

(A)            (B)

(A)             (B)

(A)             (B)

(A)  (B)

(A)  (B)

METHOD OF DESIGNING PATTERN LAYOUTS

CROSS-REFERENCE TO RELATED APPLICATION

This application claims priority under 35 U.S.C. §119 to Korean Patent Application No. 10-2012-0031772 filed on Mar. 28, 2012, the disclosure of which is hereby incorporated by reference in its entirety.

BACKGROUND

1. Field

Embodiments of the inventive concept relate to a method of designing pattern layouts of a semiconductor device.

2. Description of the Related Art

Various correction methods have been proposed in which an optical proximity effect and a long range effect can be compensated, due to fine a pattern of a semiconductor device.

SUMMARY

In accordance with an aspect of the inventive concept, a method of correcting pattern layouts of a photomask is provided.

In accordance with another aspect of the inventive concept, a method of quickly correcting pattern layouts of a photomask more efficiently is provided.

In accordance with still another aspect of the inventive concept, a method of accurately correcting pattern layouts of a photomask is provided.

In accordance with yet another aspect of the inventive concept, a method of separately performing various methods of correcting pattern layouts of a photomask by each component is provided.

In accordance with yet another aspect of the inventive concept, a method of separately performing equal correcting and different correcting of pattern layouts of a photomask is provided.

An embodiment of the inventive concept provides a method of designing patterns, including defining one shot area including a plurality of chip areas, generating an initial common layout in the plurality of chip areas, primarily correcting the initial layout to form a primary corrected layout, and secondarily correcting the primary corrected layout independently to form a plurality of secondary corrected layouts.

Each of the plurality of chip areas in the one shot area may correspond to one semiconductor chip.

The one shot area may be an area to be simultaneously exposed by performing a single scanning process in a photolithography process.

The primary corrected layout may be applied in common to the plurality of chip areas.

Primarily correcting the initial layout may include compensating for an optical proximity effect.

Secondarily correcting the primary corrected layout may include correcting each primary corrected layout independently so as to correspond to each chip area.

Secondarily correcting the primary corrected layout may be repeated by a number of the respective chip areas.

Secondarily correcting the primary corrected layout may include compensating for a long range effect.

The secondary corrected layout may correspond to each chip area of the plurality of chip independently.

The method may further include forming a final layout by collecting the secondary corrected layouts corresponding to the plurality of chip areas.

The secondary corrected layout may be identical to a layout of an optical pattern to be formed on a photomask.

The initial layout may be identical to a layout of a physical pattern to be formed on a semiconductor wafer.

Another embodiment of the inventive concept provides a method of designing patterns, including defining a shot area including a first chip area and a second chip area, generating an initial layout corresponding to the first chip area and the second chip area in common, forming a primary corrected layout corresponding in common to the first chip area and the second chip area by performing a primary correction, in which an optical proximity effect is compensated for, on the initial layout, forming a first secondary corrected layout corresponding to the first chip area by performing a secondary correction, in which a correction value corresponding to the first chip area is applied, on the primary corrected layout, and forming a second secondary corrected layout corresponding to the second chip area by performing a secondary correction, in which a correction value corresponding to the second chip area is applied, on the primary corrected layout.

The first chip area may be located at a center of the shot area, and the second chip area is located at a periphery of the shot area.

The method may further include forming a final layout including the first secondary corrected layout and the second secondary corrected layout.

Another embodiment of the inventive concept provides a method of designing patterns, including defining one shot area including a plurality of chip areas, generating an initial layout in the plurality of chip areas, such that the initial layout is common to the plurality of chip areas, primarily correcting the initial layout to form a primary corrected layout, such that the primary corrected layout is common to the plurality of chips areas, and secondarily correcting the primary corrected layout to form an independent secondary corrected layout for each one of the plurality of chip areas.

Primarily correcting the initial layout may include a single correcting process to form the primary corrected layout.

Secondarily correcting the primary corrected layout may include a plurality of correcting process, a total number of correcting processes for the primarily correcting and secondarily correcting is n+1, where n is a total number of the plurality of chip areas.

Primarily correcting the initial layout may include correcting all the chip areas identically.

Secondarily correcting the primary corrected layout may include correcting each primarily corrected chip areas independently of other chip areas.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figures 1, 2:
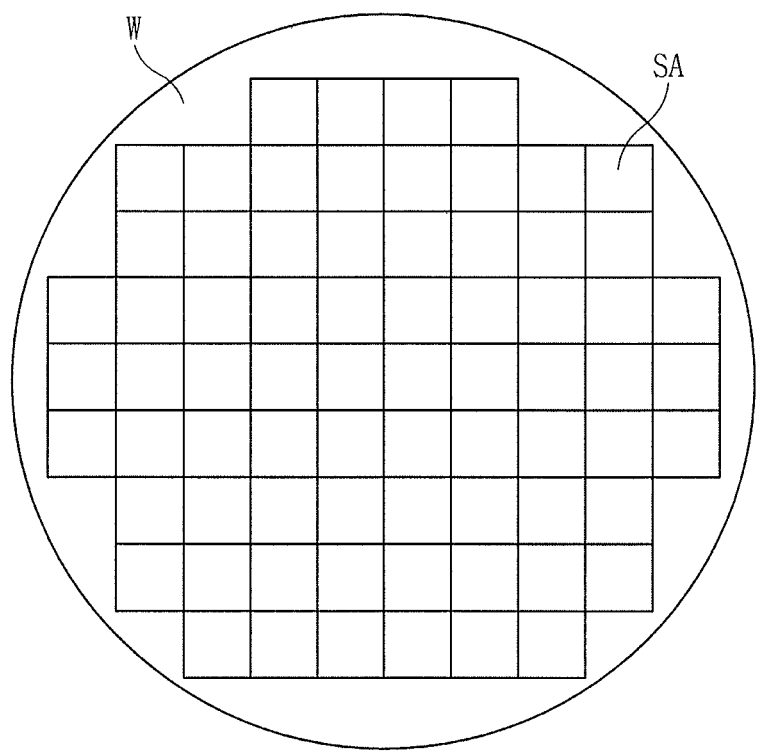
FIG. 1 illustrates a top view conceptually illustrating a semiconductor wafer according to an embodiment of the inventive concept.
FIG. 2 illustrates a top view conceptually illustrating a shot area of the semiconductor wafer shown in FIG. 1.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the drawing figures, the dimensions of layers and regions may be exaggerated for clarity of illustration. It will also be understood that when a layer (or element) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Further, embodiments are described herein with reference to schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a top view conceptually illustrating a semiconductor wafer W according to an embodiment of the inventive concept. Referring to FIG. 1, one semiconductor wafer W may include a plurality of shot areas SA. One shot area SA may mean an area, i.e., a total area, to be simultaneously exposed in an exposure process once. For example, in a reflective photolithography process using extreme ultraviolet (EUV) light, one shot area SA may refer to an area, i.e., the entire area, exposed in a single scanning process. For example, if the semiconductor wafer W in FIG. 1 includes a total of seventy (70) shot areas SA, the semiconductor wafer W may be treated by the exposure process, i.e., scanned, a total of seventy (70) times.

FIG. 2 is a top view conceptually illustrating one shot area SA of the semiconductor wafer shown in FIG. 1. Referring to FIG. 2, one shot area SA may include a plurality of chip areas CA, e.g., twenty five (25) chip areas C11 to C55. One chip area CA may correspond to one semiconductor chip. According to an embodiment of the inventive concept, a plurality of chip areas CA may be simultaneously exposed by performing a scanning process one time in a photolithography process, for example, a reflective photolithography process once. Thus, according to the inventive concept, since the plurality of chip areas CA may be simultaneously exposed through the exposure process once, throughputs can be increased and productivity can be improved. The number of the chip areas CA included in one shot area SA shown in FIG. 2 is exemplified. A few or more chip areas CA may be included in one shot area SA depending on a product, photolithography technology and manufacturing technology.

Figure 3:
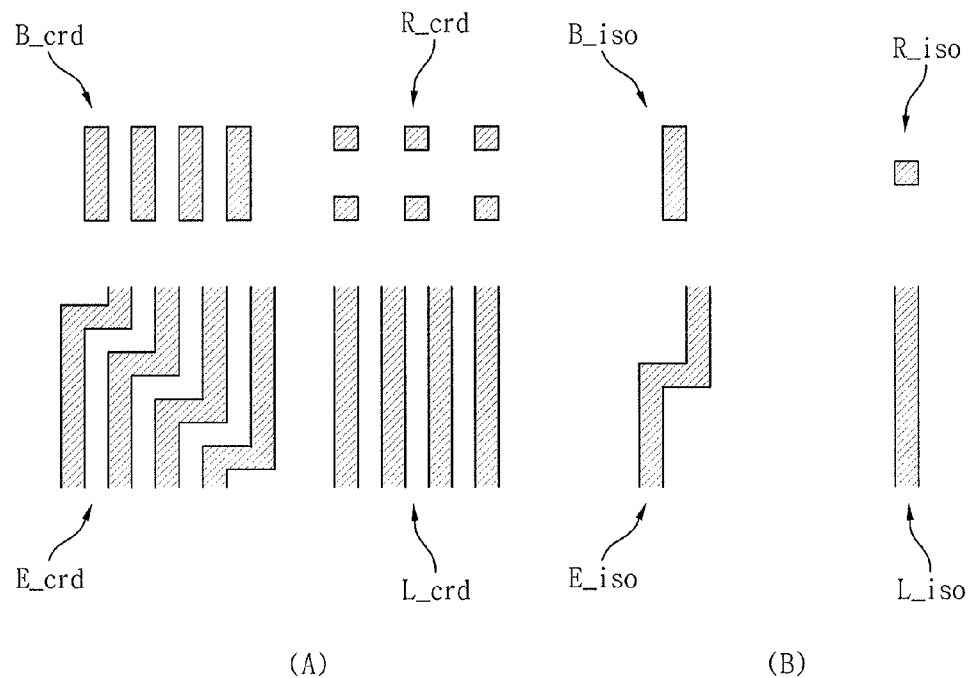
FIG. 3 illustrates a view illustrating some representative shapes of patterns of a semiconductor chip.

FIG. 3 is a view illustrating several kinds of typical shapes of physical patterns of chip areas CA in order to explain the inventive concept. Referring to FIG. 3(A), the chip areas CA may include crowded patterns, e.g., bar-type patterns B_crd, quadrangular patterns R_crd, elbow patterns E_crd, and/or striped-type patterns L_crd, which have relatively high pattern density. For example, a plurality of the patterns B_crd, R_crd, E_crd, and L_crd having relatively high density may be arranged to be adjacent to one another thereabout. Thus, the relatively high pattern density may be relatively strongly influenced by various optical, chemical, and environmental factors from surrounding patterns. Referring to FIG. (B), the chip areas CA may include isolated patterns, e.g., bar-type patterns B_iso, quadrangular patterns R_iso, elbow patterns E_iso, and/or stripe-type patterns L_iso, which have relatively low pattern density. For example, the patterns B_iso, R_iso, E_iso, and L_iso of relatively low density may not be adjacent to one another, or may be separated from one another enough not to affect one another even when the patterns are adjacent to one another. Thus, patterns of relatively low pattern density may be influenced only to a negligible degree or not influenced by all by various optical, chemical, and environmental factors from surrounding patterns. It is assumed that the shapes of the patterns shown in FIG. 3 are ultimately formed on the semiconductor wafer W.

Figure 4:
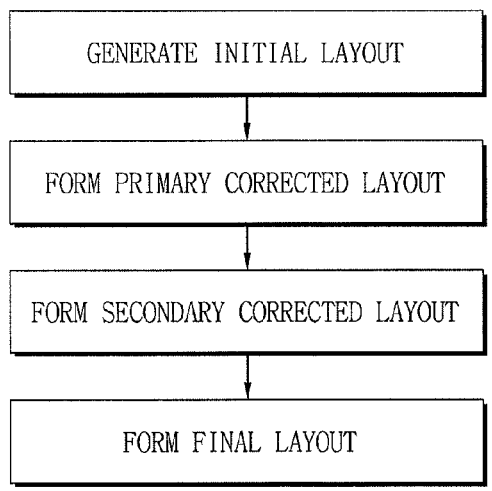
FIG. 4 illustrates a flowchart conceptually illustrating a pattern design method according to an embodiment of the inventive concept.

FIG. 4 is a flowchart conceptually illustrating a pattern design method according to an embodiment of the inventive concept, and FIGS. 5A to 5D are views conceptually illustrating layouts by which shapes of various patterns are corrected using a pattern design method according to an embodiment of the inventive concept.

Figure 5A:
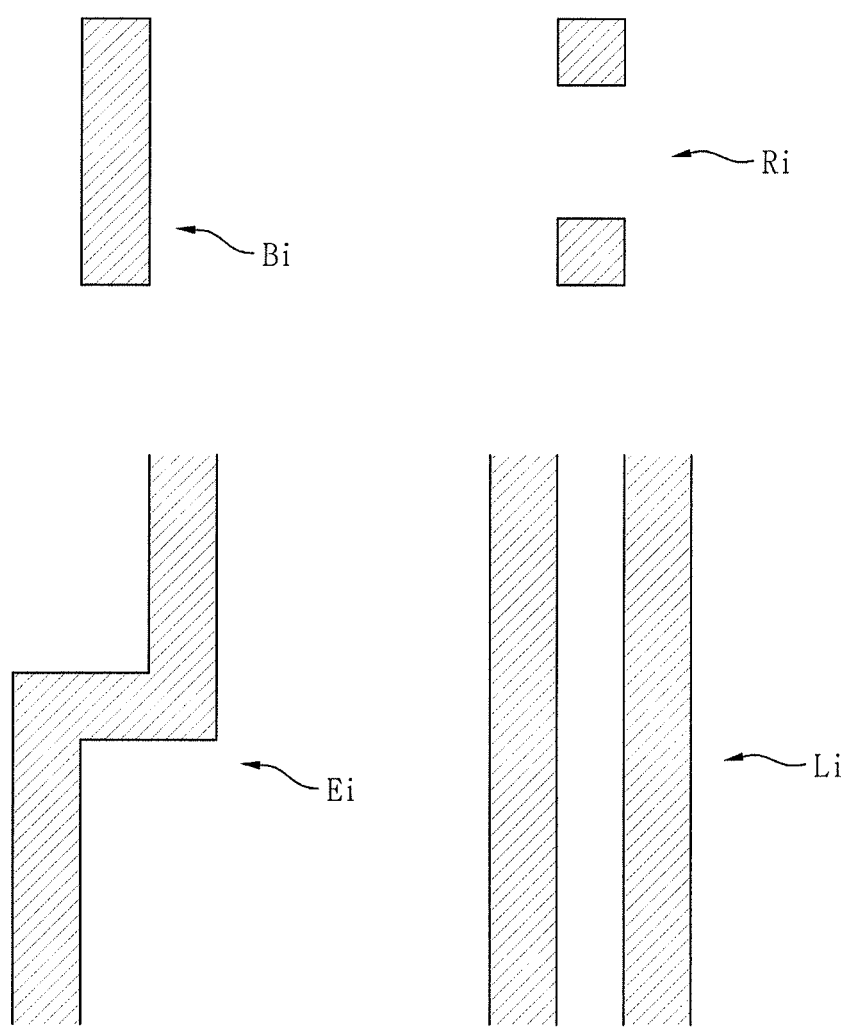
FIGS. 5A to 5D are layouts conceptually illustrating that shapes of various patterns are corrected using the pattern design method according to the embodiment of the inventive concept.

Referring to FIGS. 4 and 5A, the pattern design method according to the embodiment of the inventive concept may include forming an initial layout 10A. For example, the initial layout 10A may include optical patterns Bi, Ri, Ei and Li, which have the same shapes as physical patterns to be ultimately formed on the semiconductor wafer W. The initial layout 10A may correspond to a sheet of photomask layer that is used in one step among a plurality of photolithography processes for manufacturing a semiconductor device. Thus, the initial layout 10A may optionally include a bar-type pattern Bi, a quadrangular pattern Ri, an elbow pattern Ei, and/or a striped pattern Li. For example, the quadrangular pattern Ri may be a rectangular or a square shaped pattern, and the striped pattern Li may include a plurality of lines separated by spaces.

Figure 5B:
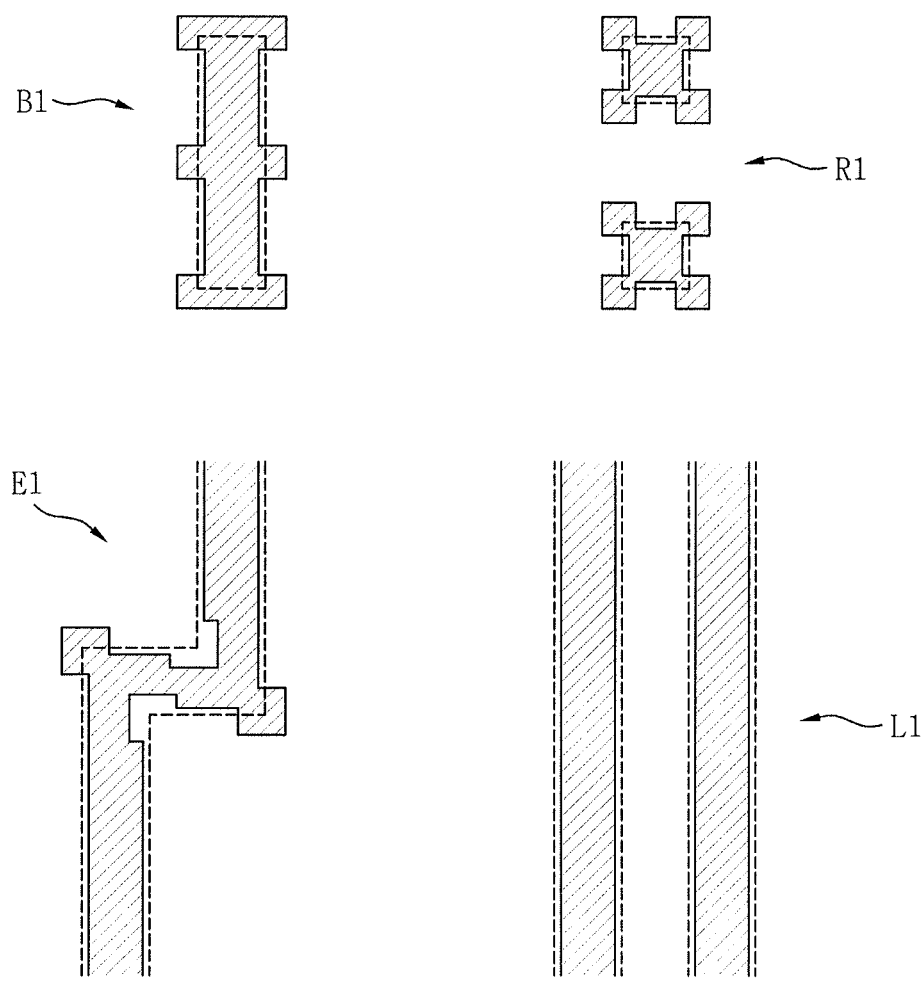

Referring to FIGS. 4 and 5B, the pattern design method according to the embodiment of the inventive concept may include primarily correcting the initial layout 10A to form a primary corrected layout 10B. The primary correction of the initial layout 10A may include compensating for an optical proximity effect. The optical proximity effect may include forming a shape having a pattern different from a designed shape through diffraction, interference, or reflection of light. For example, compensating for the optical proximity effect may include correction of reinforcing corner portions, correction of reducing protruding side portions, and correction of further reducing recessed reverse corner portions in each pattern Bi, Ri, Ei, and Li. In order to easily understand the inventive concept, the initial layout 10A is indicated by a dotted line in FIG. 5B, while the primary corrected layout 10B is indicated by a solid line. This correction is illustrative. The correction of compensating for the optical proximity effect may be variously corrected by considering arrangements, shapes, sizes, densities of the patterns Bi, Ri, Ei, and Li, and intervals between adjacent patterns.

Figure 5C:
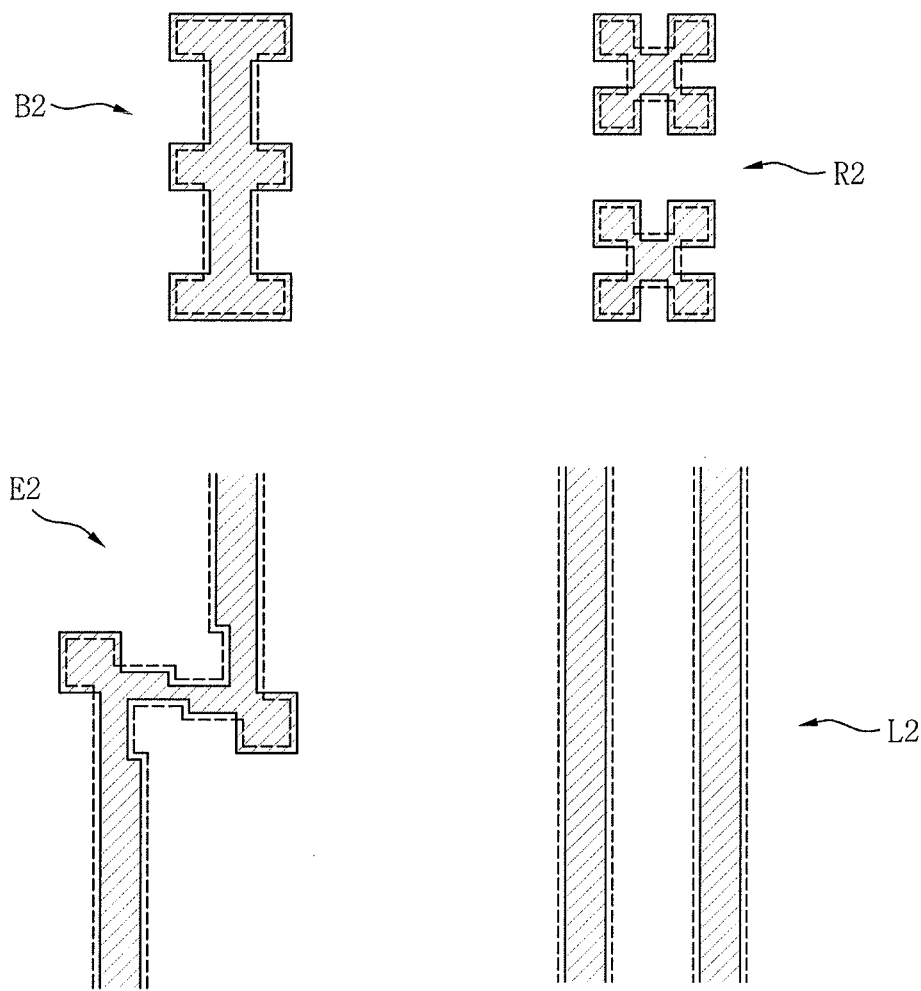

Referring to FIGS. 4 and 5C, the pattern design method according to the embodiment of the inventive concept may include secondarily correcting the primary corrected layout 10B to form a secondary corrected layout 10C. For example, the secondary correction of the primary corrected layout 10B may include compensating for a long range effect. Compensating for the long range effect may include compensating for patterns of the same shape being formed in different shapes according to locations in an area once exposed in the photolithography process, e.g., one shot area (SA) or one chip area (CA) in FIGS. 1 and 2. When an exposure process is performed using a reflective photolithography system, the long range effect may include a flare effect, i.e., when light is focused on a particular portion to be stronger on the particular portion than on other portions, a black border effect, i.e., when light is weakly irradiated to make a certain portion visible in black, a loading effect, i.e., caused by a change of density of reactors in a developing process or an etching process, and the like.

The correction for compensating for the long range effect may include a correction performed in the same direction as in the correction for compensating for the optical proximity effect, or a correction performed in the opposite direction thereof. For example, the correction for the long range effect may include further increasing increased patterns to further correct, e.g., to fine-tune, the optical proximity effect or may conversely include decreasing the increased patterns. This embodiment will be described under the assumption that the correction for the optical proximity effect is performed in the same manner as the correction for the long range effect, as an example. However, correction values are set to different values and thus two corrections will be represented or described differently.

Figure 5D:
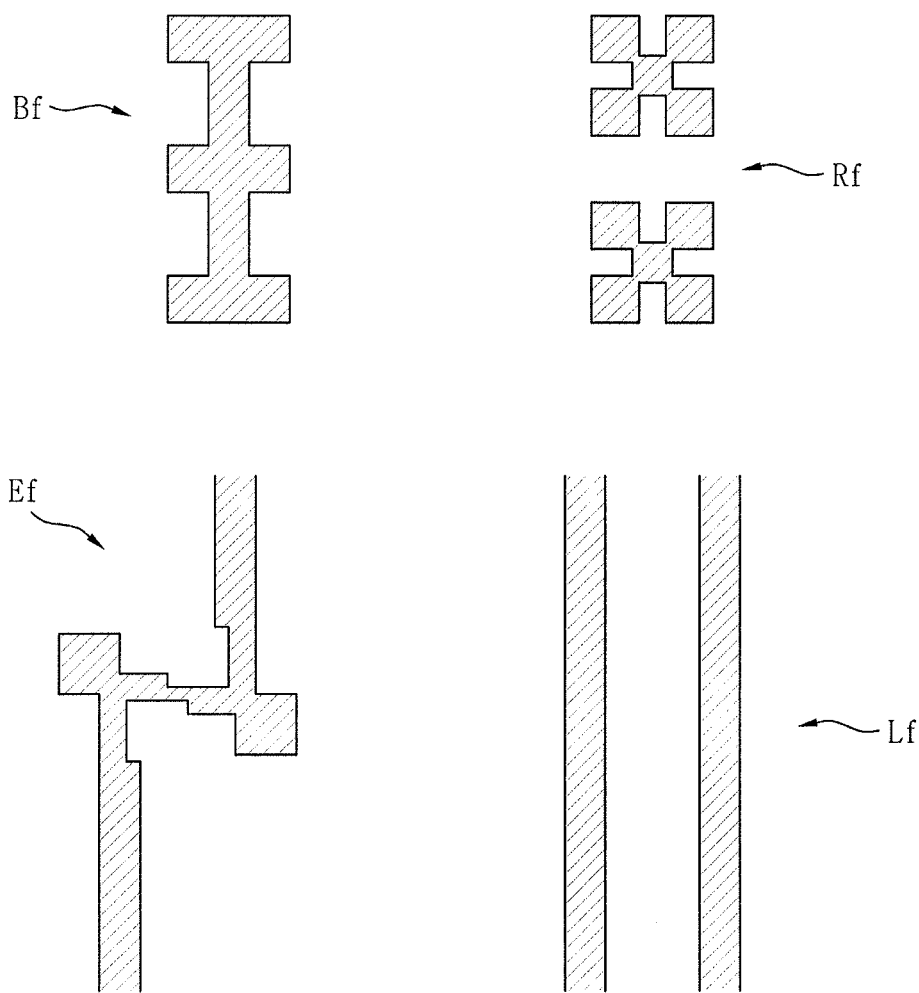

Referring to FIGS. 4 and 5D, the pattern design method according to the embodiment of the inventive concept may include removing components of the initial layout 10A and the primary corrected layout 10B in the secondary corrected layout 10C and completing a final layout 10D having the same arrangement as the chip areas CA included in the shot area SA shown in FIGS. 1 and 2. For example, the secondary corrected layout 10C or the final layout 10D may include patterns Bf, Rf, Ef, and Lf having shapes to be optically exposed or formed on a photomask. The secondary corrected layout 10C or the final layout 10D may mean layout data for manufacturing the photomask, e.g., shapes of the patterns to be displayed on a computer monitor. According to the inventive concept, the secondary corrected layout 10C or the final layout 10D may be optically or aerially drawn on a blank photomask using electron beams, as the same shape as the secondary corrected layout 10C and the final layout 10D in an exposure apparatus, e.g., an electron beam lithography apparatus, for manufacturing a photomask.

Figure 6:
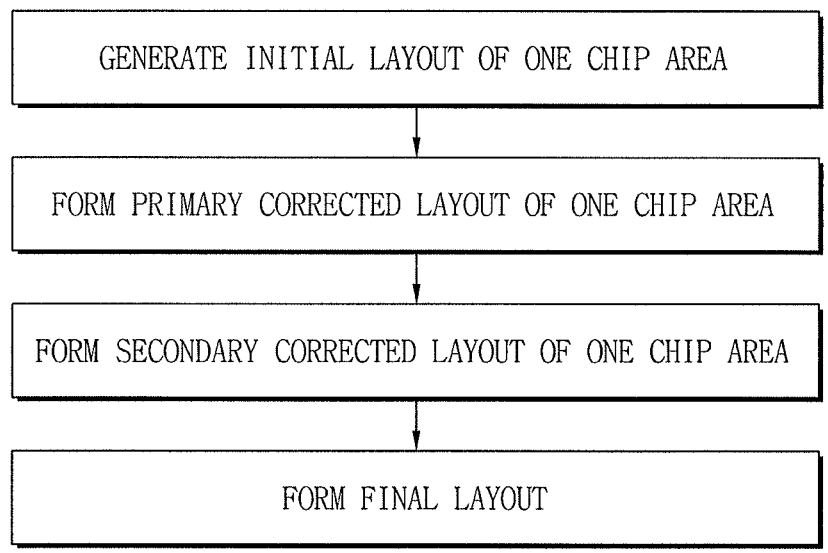
FIG. 6 illustrates a flowchart conceptually illustrating a pattern design method according to an embodiment of the inventive concept.

FIG. 6 is a flowchart conceptually illustrating a pattern design method according to an embodiment of the inventive concept, and FIGS. 7A to 7D are layouts conceptually illustrating shapes of various patterns corrected using the pattern design method according to the embodiment of the inventive concept. As an example, it is illustrated that patterns of the same shape may be differently corrected in one chip area (CA).

Figure 7A:
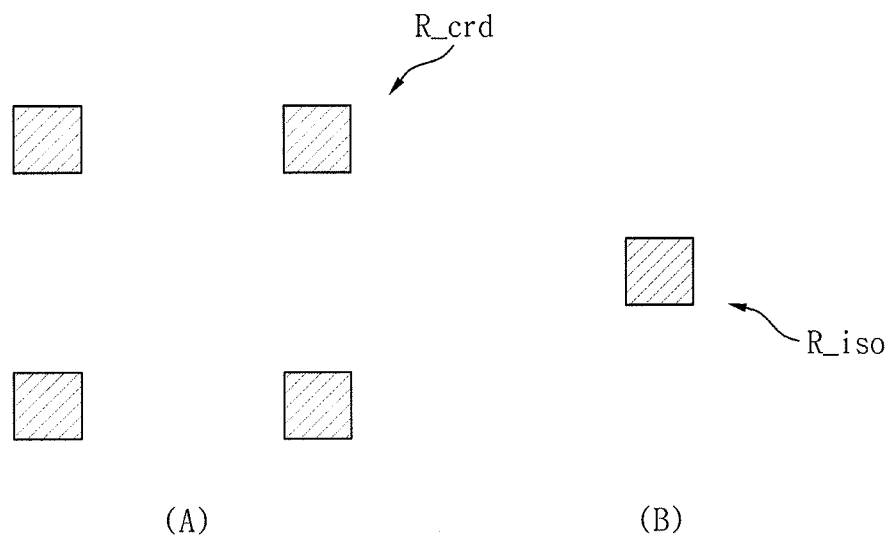
FIGS. 7A to 7D are layouts conceptually illustrating that shapes of various patterns are corrected using the pattern design method according to the embodiment of the inventive concept.

Referring to FIGS. 6 and 7A, the pattern design method according to the embodiment of the invention concept may include generating an initial layout 20A. The initial layout 20A may correspond to one chip area CA. The initial layout 20A may be identical to a final pattern shape to be formed on the semiconductor wafer. For example, the initial layout 20A may include the patterns R_crd and R_iso. Referring to (A) and (B) in FIG. 7A, the initial layout 20A may include the quadrangular pattern R_crd of a relatively high density and the quadrangular pattern R_iso of a relatively low density. For example, the quadrangular pattern R_crd of the relatively high density may be located in a central region or a cell region within the one chip area CA and the quadrangular pattern R_iso of the relatively low density may be located in a peripheral region within the one chip area CA.

Figure 7B:
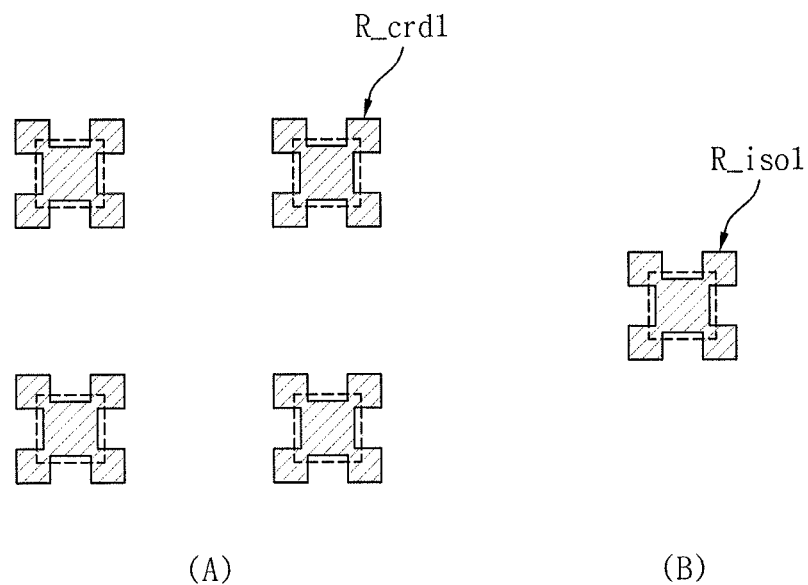

Referring to FIGS. 6 and 7B, the pattern design method according to the embodiment of the inventive concept may include primarily correcting the initial layout 20A and forming a primary corrected layout 20B. For example, primarily correcting the initial layout 20A may include compensating for the optical proximity effect within the one chip area CA. In compensating for the optical proximity effect, different correction values may be applied to the quadrangular pattern R_crd of the relatively high density and the quadrangular pattern R_iso of the relatively low density. However, in order to easily understand the inventive concept, it will be assumed and described that identical correction values are applied to the quadrangular patterns R_crd of the relatively high density and the quadrangular pattern R_iso of the relatively low density.

Figure 7C:
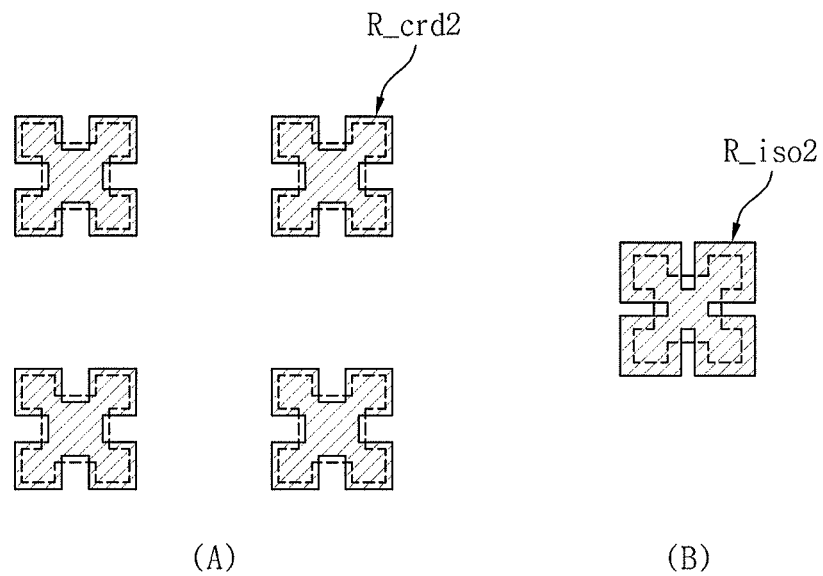

Referring to FIGS. 6 and 7C, the pattern design method according to the embodiment of the inventive concept may include secondarily correcting the primary corrected layout 20B and forming a secondary corrected layout 20C. For example, secondarily correcting the primary corrected layout 20B may include compensating for the long range effect within the one chip area CA. For example, the secondary correction may include different correction values applied to the quadrangular pattern R_crd1 of the relatively high density and the quadrangular pattern R_iso2 of the relatively low density. For example, it is applied such that a correction value of the quadrangular pattern R_iso2 of the relatively low density is larger than that of the quadrangular pattern R_crd2 of the relatively high density. Since influences of the long range effect are different in areas of different densities, different correction values should be applied so that the influences of the long range effect can be adjusted accordingly, e.g., reduced further.

Figure 7D:
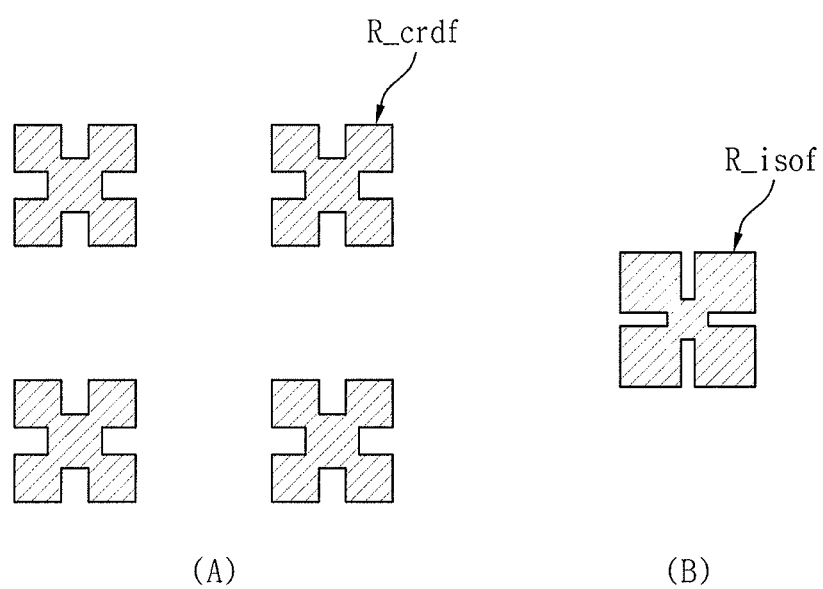

Referring to FIGS. 6 and 7D, the pattern design method according to the embodiment of the inventive concept may include completing a final layout 20D by removing components of the initial layout 20A and of the primary corrected layout 20B from the secondary corrected layout 20C. The secondary corrected layout 20C or the final layout 20D may include at least two patterns in which different correction values are applied to the same patterns. In the drawings, the rectangular patterns R_crdf and R_isof which are applied with the different correction values are shown. For example, the secondary corrected layout 20C or the final layout 20D may include shapes of patterns to be exposed or formed on a photomask. The secondary corrected layout 20C or the final layout 20D may mean layout data for manufacturing the photomask. For example, it means shapes of patterns to be displayed on a computer monitor. According to the inventive concept, in an exposure apparatus, e.g., an electron beam lithography apparatus for manufacturing the photomask, the same shapes as the secondary corrected layout 20C or the final layout 20D will be optically drawn on a blank photomask using the electron beam. The secondary corrected layout 20C and the final layout 20D may be the same.

Figure 8:
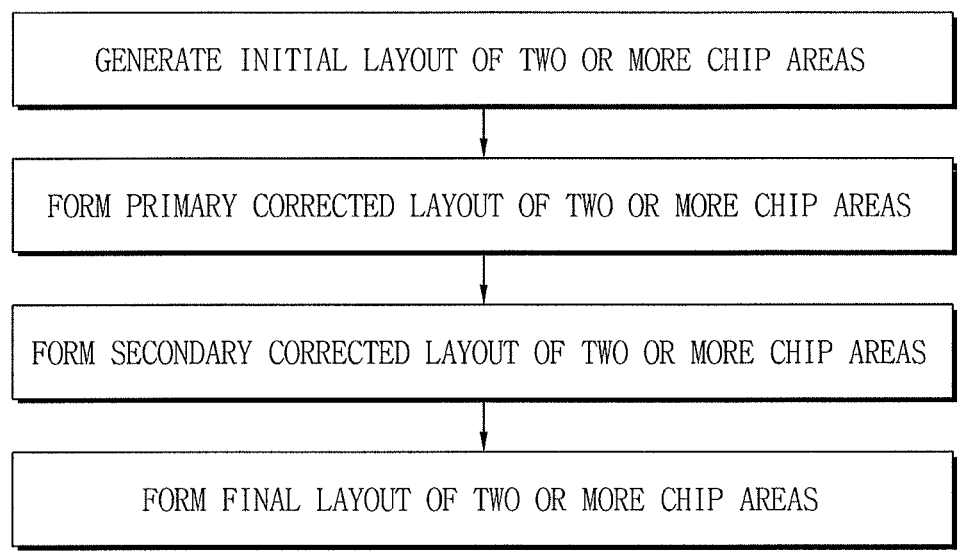
FIG. 8 illustrates a flowchart conceptually illustrating a pattern design method according to an embodiment of the inventive concept.

FIG. 8 is a flowchart conceptually illustrating a pattern design method according to an embodiment of the inventive concept. FIGS. 9A to 9D are layouts conceptually illustrating patterns corrected using the pattern design method according to the embodiment of the inventive concept. Referring to FIGS. 1 and 2 again, it will be described that shapes of the same patterns may be differently corrected within two chip areas CA located in the one shot area SA. For example, it is considered and described that the shapes of the same patterns may be formed in one of a central chip area C33 and the outer chip areas C11, C15, C51 and C55.

Figure 9A:
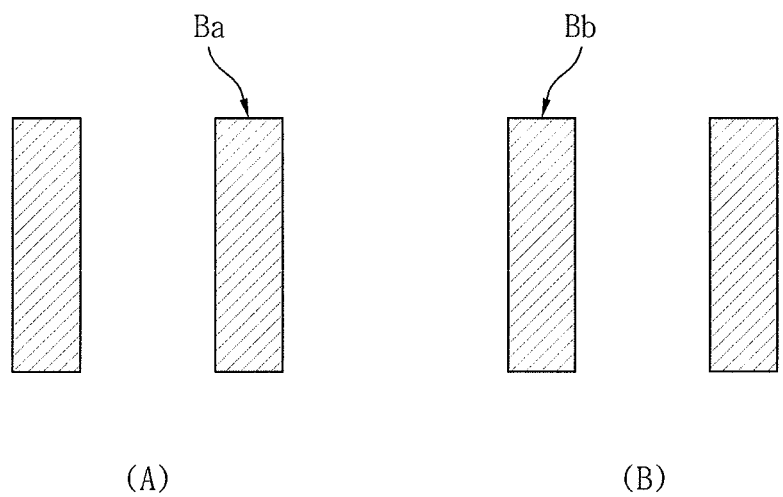
FIGS. 9A to 9D are layouts conceptually illustrating that a pattern is corrected using the pattern design method according to the embodiment of the inventive concept.

Referring to FIGS. 8 and 9A, the pattern design method according to the embodiment of the inventive concept may include generating an initial layout 30A to be applied in common to the at least two chip areas CA. For example, the initial layout 30A may include the same shape of patterns Ba and Bb located in any one of chip area C33 located at a center of the shot area SA and chip areas C11, C15, C51 and C55 located at corners of thereof. For example, part (A) of FIG. 9A can refer to a layout of patterns of the central chip area C33, and part (B) of FIG. 9B can refer a layout of the patterns of an outer, e.g., peripheral, chip areas C11, C15, C51 and C55. For example, the initial layout 30A may include bar type patterns Ba and Bb.

Figure 9B:
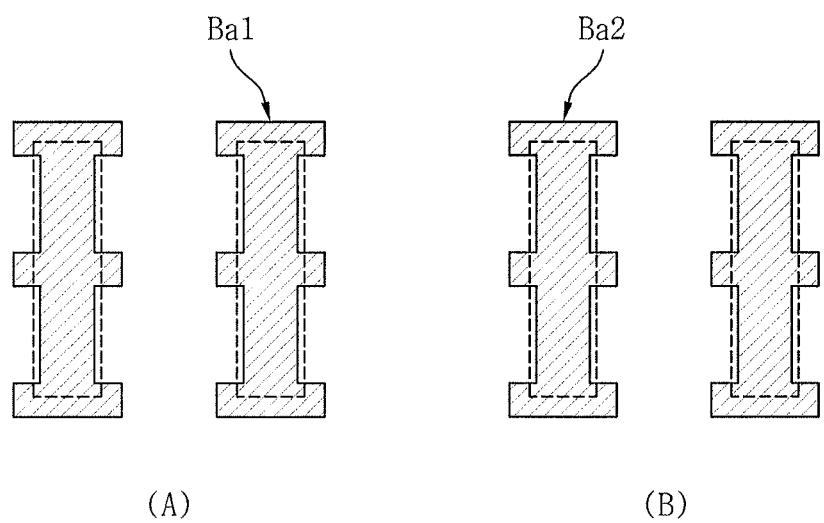

Referring to FIGS. 8 and 9B, the pattern design method according to the embodiment of the inventive concept may include primarily correcting the initial layout 30A and forming a primary corrected layout 30B to be applied in common to the at least two chip areas CA. For example, primarily correcting the initial layout 30A may include compensating for the optical proximity effect. For example, a primary correction value may be equally applied to the layout of patterns of the central chip area C33 and the layout of patterns of the outer chip areas C11, C15, C51 and C55. Accordingly, the primary corrected layout 30B may be corrected to have the same shape within the central chip area C33 and the outer chip areas C11, C15, C51 and C55.

Figure 9C:
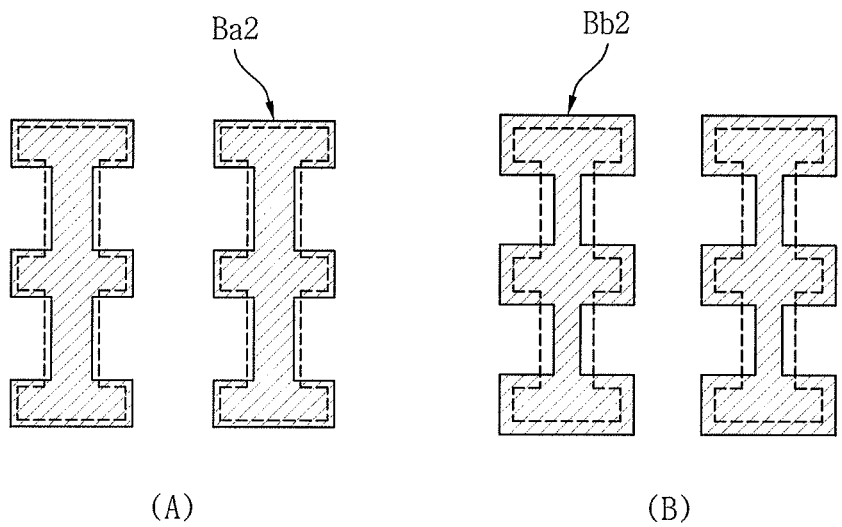

Referring to FIGS. 8 and 9C, the pattern design method according to the embodiment of the inventive concept may include secondarily correcting the primary corrected layout 30B and forming a secondary corrected layout 30C to be applied to each of the at least two chip areas CA. For example, secondarily correcting the primary corrected layout 30B may include compensating for the long range effect. For example, the secondary correction may include applying different secondary correction values to the layout of patterns of the central chip area C33 and the layout of patterns of the outer chip areas C11, C15, C51 and C55. FIG. 9C illustratively shows an example in which a larger correction value may be applied to the layout of patterns of the outer chip areas C11, C15, C51 and C55. Of course, conversely to this, the secondary correction value smaller than that of the central chip area C33 may be applied to the layout of patterns of the outer chip areas C11, C15, C51 and C55.

Figure 9D:
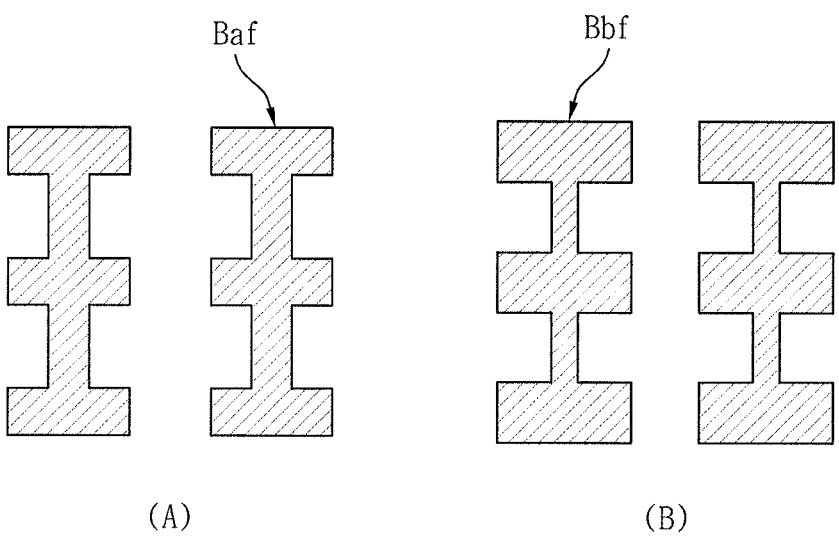

Referring to FIGS. 8 and 9D, the pattern design method according to the embodiment of the inventive concept may include completing a final layout 30D including layouts of the at least two chip areas CA by removing components of the layout 30A or the primary corrected layout 30B in the secondary corrected layout 30C of the at least two chip areas CA. For example, the secondary corrected layout 30C or the final layout 30D may include a shape of patterns to be optically exposed or formed on the photomask. The secondary corrected layout 30C or the final layout 30D may mean layout data for manufacturing the photomask, e.g., shapes of the patterns to be displayed on a computer monitor. According to the inventive concept, in an exposure apparatus, e.g., in an electron beam lithography apparatus for manufacturing the photomask, same shapes as the secondary corrected layout 30C or the final layout 30D will be optically drawn on a blank photomask using the electron beam.

Figure 10:
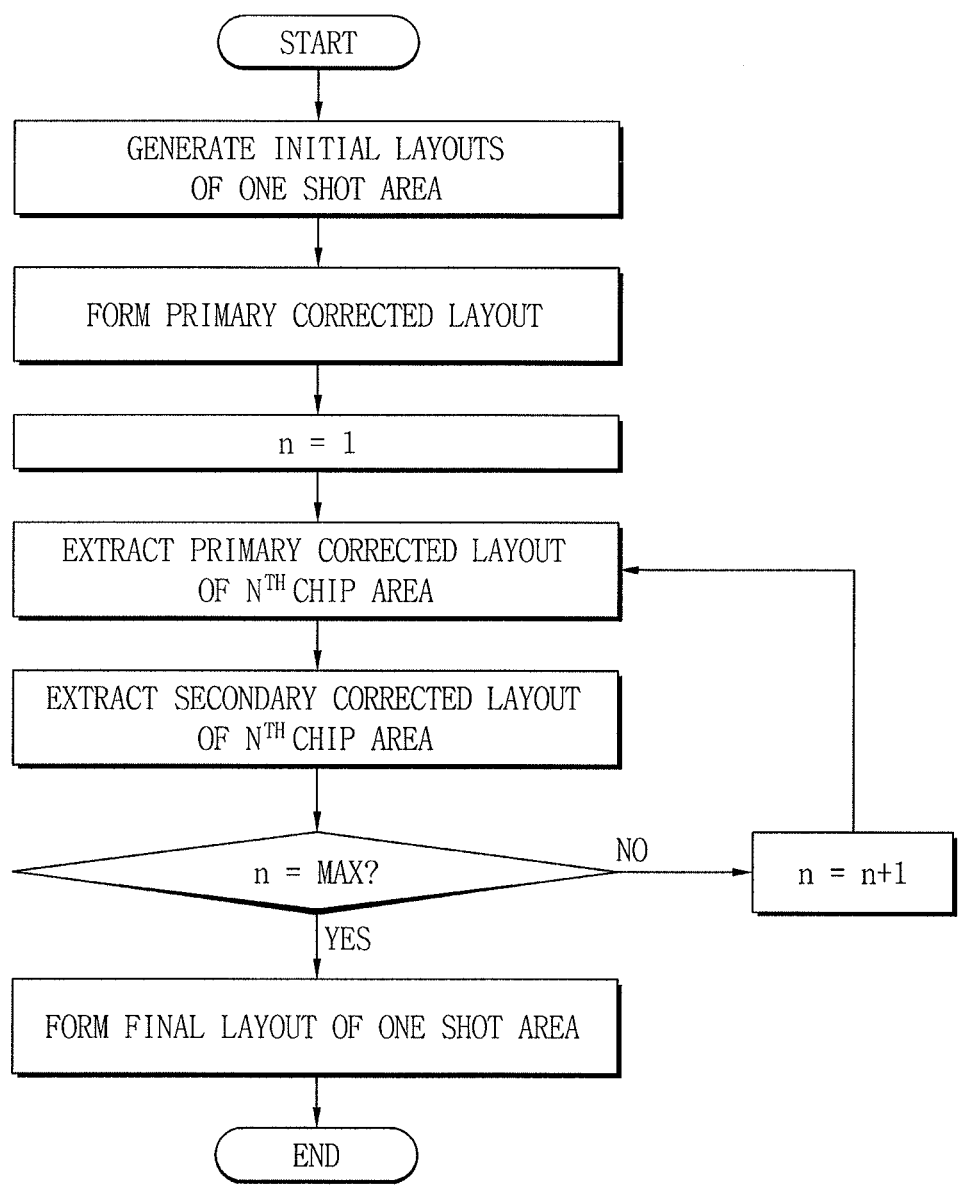
FIG. 10 illustrates a flowchart conceptually illustrating a pattern design method according to an embodiment of the inventive concept.

FIG. 10 is a flowchart conceptually illustrating a pattern design method according to an embodiment of the inventive concept. FIGS. 11A to 11D are layouts conceptually illustrating various patterns corrected using the pattern design method according to the embodiment of the inventive concept. Referring to FIG. 2 again, a method of correcting layouts of patterns of all chip areas C11 to C55 located in one shot area SA will be described.

Figure 11A:
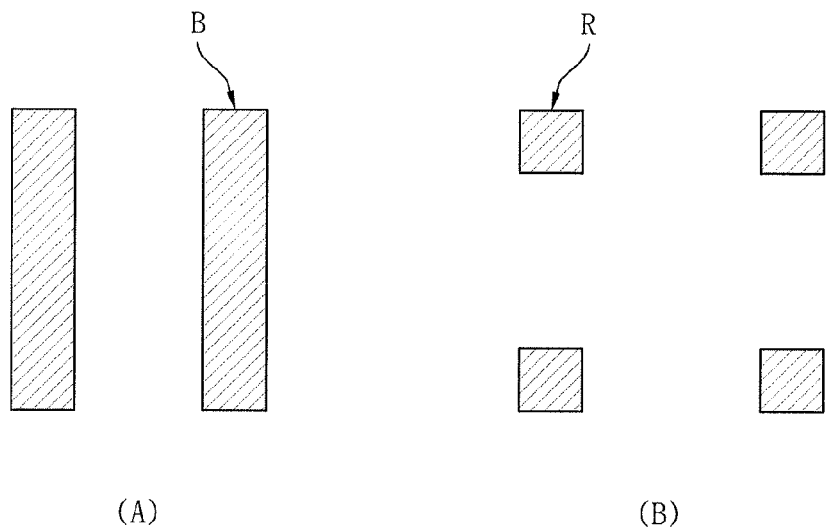
FIGS. 11A to 11D are layouts conceptually illustrating that various patterns are corrected using the pattern design method according to the embodiment of the inventive concept.

Referring to FIGS. 10 and 11A, the pattern design method according to the embodiment of the inventive concept may include generating an initial layout 40A of one shot area SA. The initial layout 40A may be identical to a shape of patterns to be formed on a semiconductor wafer W. Referring to FIGS. 2 and 3 again, all the chip areas C11 to C55 within the one shot area SA may include the same initial layout 40A. For example, the initial layout 40A shown in the drawings may be applied in common to all the chip areas C11 to C55. FIG. 11A illustrates bar patterns B and quadrangular patterns R.

Figure 11B:
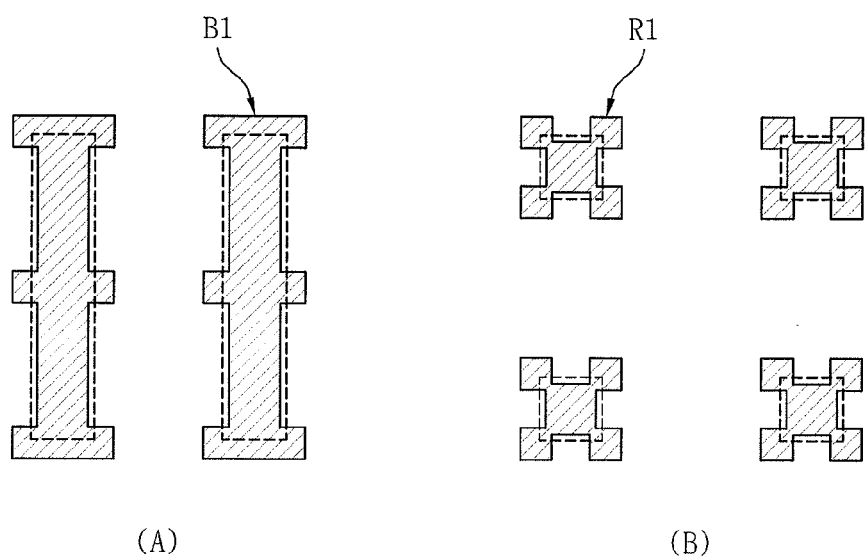

Referring to FIGS. 10 and 11B, the pattern design method according to the embodiment of the inventive concept may include primarily correcting the initial layout 40A and forming a primary corrected layout 40B. Accordingly, all the chip areas C11 to C55 may include the primary corrected layout 40B. For example, primarily correcting the initial layout 40A may include the optical proximity effect. For example, the primary corrected layout 40B may include a primarily corrected bar pattern B1 and a primarily corrected quadrangular pattern R1.

Referring to FIGS. 2 and 10, the pattern design method according to the embodiment of the inventive concept may include extracting an $n^{th}$ chip area Cn of all the chip areas C11 to C55 within the shot area SA. For example, any one of the chip areas C11 to C55 may be extracted first, e.g., n may equal 1.

Figure 11C:
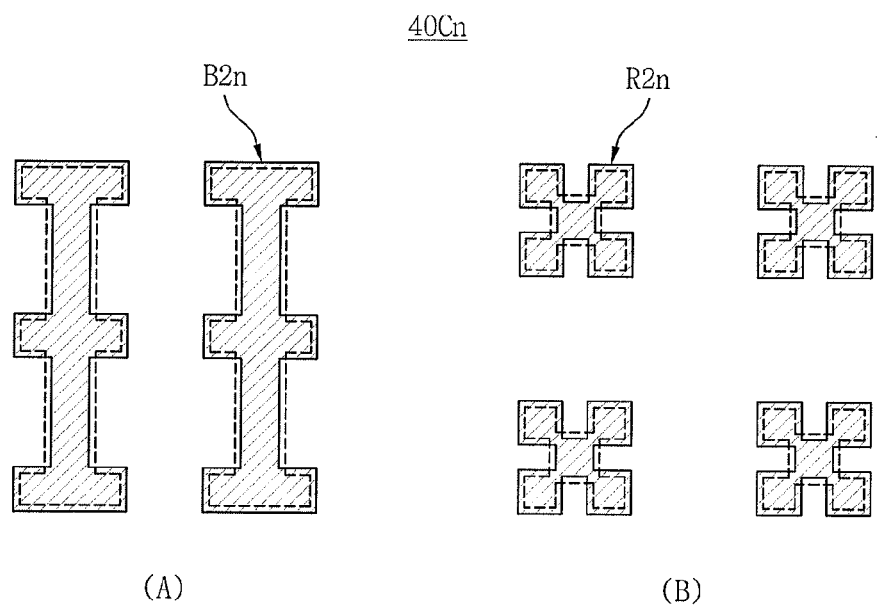

Referring to FIGS. 10 and 11C, the pattern design method according to the embodiment of the inventive concept may include secondarily correcting the primary corrected layout 40A of the extracted $n^{th}$ chip area Cn and forming a secondary corrected layout 40Cn. A secondary correction value may be prepared to be suitable to the specific characteristics of the extracted $n^{th}$ chip area Cn. For example, the secondary corrected layout 40Cn may include a secondary corrected bar pattern B2$n$ and a secondary corrected quadrangular pattern R2$n$.

Referring to FIG. 10, the pattern design method according to the embodiment of the inventive concept may include secondarily correcting the primary corrected layout 40A of each of the chip areas CA in one shot area SA. Therefore, once the primary corrected layout 40A of the extracted $n^{th}$ chip area Cn is corrected, the method includes deciding, e.g., determining, whether all the chip areas C11 to C55 included in the shot area SA are secondarily corrected. For example, it may include deciding whether n has reached its maximum value MAX, e.g., the maximum value MAX equals twenty five when there are twenty five (25) chip areas.

Figure 11D:
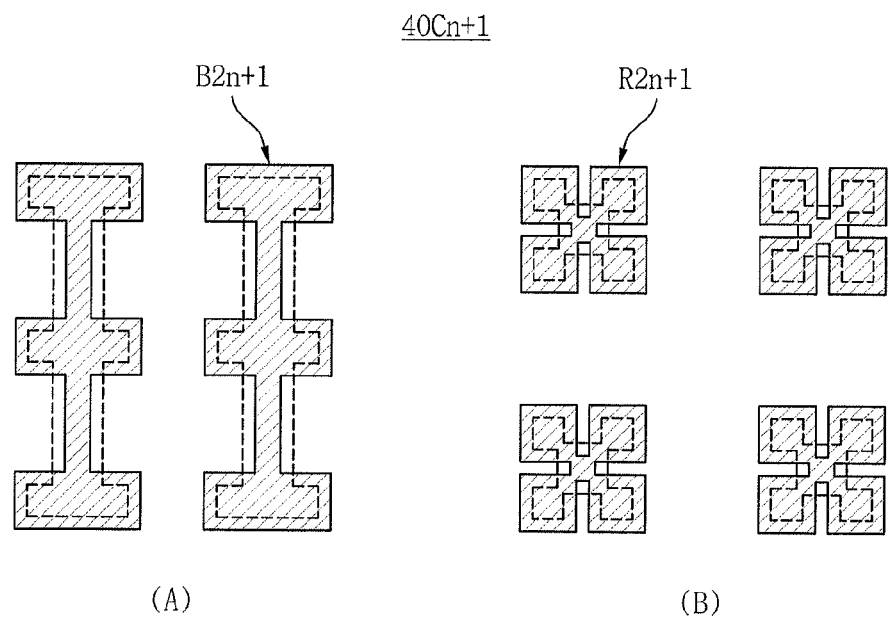

Referring to FIGS. 10 and 11D, once it is determined that not all the chip areas C11 to C55 in the shot area SA are secondarily corrected, i.e., if n does not equal the maximum value MAX, the method includes forming a secondary corrected layout 40Cn+1 of an (n+1)$^{th}$ chip area Cn+1 by extracting the (n+1)$^{th}$ chip area Cn+1 and secondarily correcting the primary corrected layout 40B of the (n+1)$^{th}$ chip area Cn+1. Referring FIGS. 11C and 11D again, according to the inventive concept, the secondary corrected layout 40Cn of the $n^{th}$ chip area Cn and the secondary corrected layout 40Cn+1 of the (n+1)$^{th}$ chip area Cn+1 may be different from each other. For example, if correction values of compensating for the long range effect of the $n^{th}$ chip area Cn and the (n+1)$^{th}$ chip area Cn+1 are different from each other, the secondary corrected layout 40Cn of the $n^{th}$ chip area Cn and the secondary corrected layout 40Cn+1 of the (n+1)$^{th}$ chip area Cn+1 will have different shapes.

Hereinafter, referring to FIG. 10, the pattern design method according to the embodiment of the inventive concept may include re-deciding, e.g., re-examining, whether all the chip areas C11 to C55 in the shot area SA are secondarily corrected. If not all the chip areas C11 to C55 are secondarily corrected, the pattern design method may include forming a secondary corrected layout 40C of a chip area Cn+2 by extracting the primary corrected layout 40B of the chip area Cn+2 to be secondarily corrected and then applying a secondary correction value to be suitable to the specific characteristics of the chip area Cn+2. This step will be repeatedly performed until the primary corrected layout 40B of all the chip areas C11 to C55 is secondarily corrected, i.e., until it is determined that n has reached its maximum value MAX. Once all of the chip areas are secondarily corrected, i.e., the primary corrected layout 40B of each of the chip areas C11 to C55 is secondarily corrected, a final layout including secondary corrected layouts 40Cx of all the chip areas C11 to C55 may be formed.

According to the inventive concept, since all the chip areas C11 to C55 included in one shot area SA may each be corrected independently, i.e., via the secondary correction, all the chip areas C11 to C55 may be corrected to be suitable to specific characteristics of their corresponding chip areas CA. In addition, since the primary correction and the secondary correction may be performed separately, a computing process for applying a total correction value may be simple, e.g., in order to correct the pattern layout of all the chip areas C11 to C55 included in one shot area SA. The computing process for applying the total correction value to which both the primary correction and the secondary correction are applied for respective chip areas CA will be repeated by a total number of all the chip areas C11 to C55. However, according to the inventive concept, since the number of times for computing the primary correction value is reduced to one time, i.e., as the primary correction is performed once for all the chips simultaneously, the total of computing processes may be shortened and simplified. In addition, since a quantity of data, which is also required for correcting in the secondary correction, may be reduced, time for computing the secondary correction value may be also shortened.

According to the inventive concept, the correction for compensating for the long range effect is first performed, and then the correction for compensating for the optical proximity effect may be performed later. For example, the correction for compensating for the long range effect may be first performed in the primary correction, and then the correction for compensating for the optical proximity effect may be performed in the secondary correction.

Figure 12:
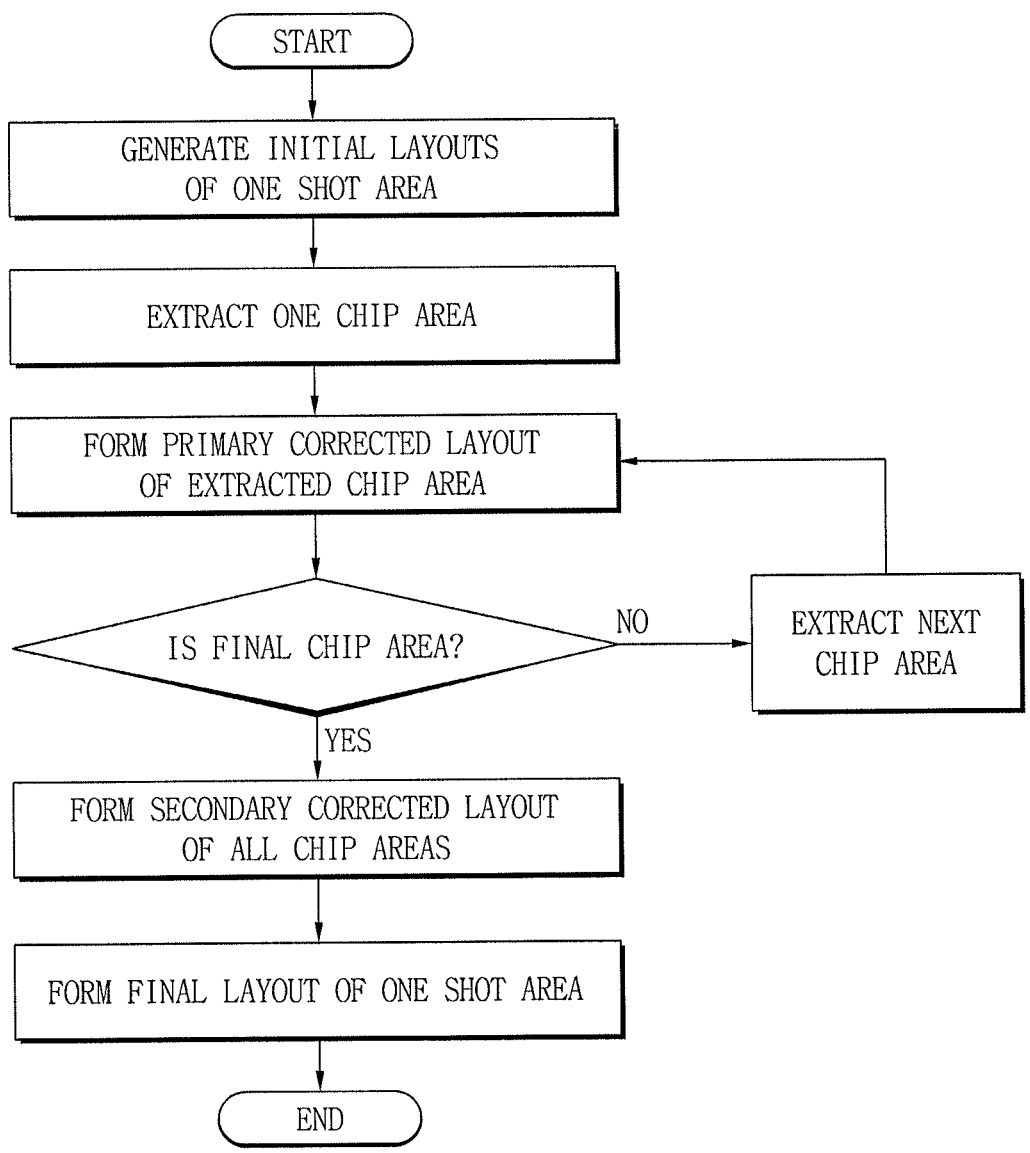
FIG. 12 illustrates a flowchart conceptually illustrating a pattern design method according to an embodiment of the inventive concept.

FIG. 12 is a flowchart conceptually illustrating a pattern design method according to an embodiment of the inventive concept, and FIGS. 13A to 13E are layouts conceptually illustrating that various patterns are corrected using the pattern design method according to the embodiment of the inventive concept. For example, it will be described that the correction for compensating for the long range effect is first performed in the primary correction, and then the correction for compensating for the optical proximity effect is performed in the secondary correction.

Figure 13A:
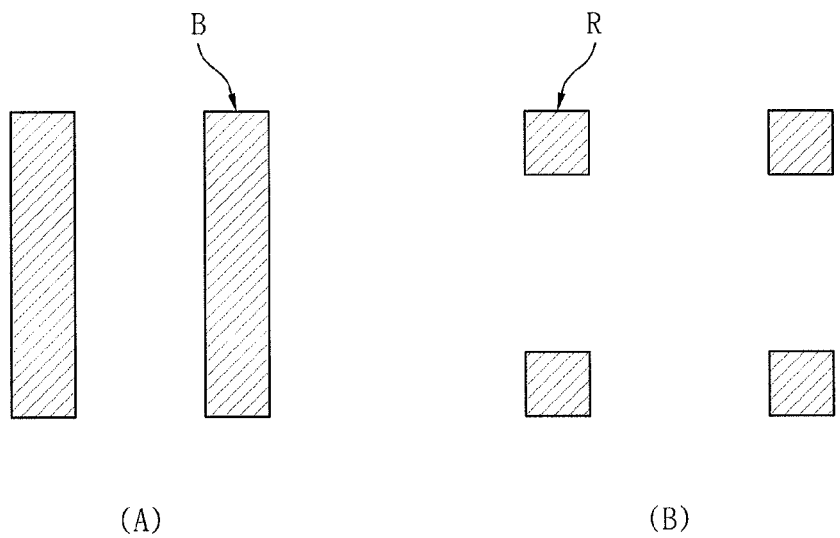
FIGS. 13A to 13E are layouts conceptually illustrating that various patterns are corrected using the pattern design method according to the embodiment of the inventive concept.

Referring to FIGS. 12 and 13A, the pattern design method according to the embodiment of the inventive concept may include generating an initial layout 50A including in common all the chip areas C11 to C55 of one shot area SA.

Figure 13B:
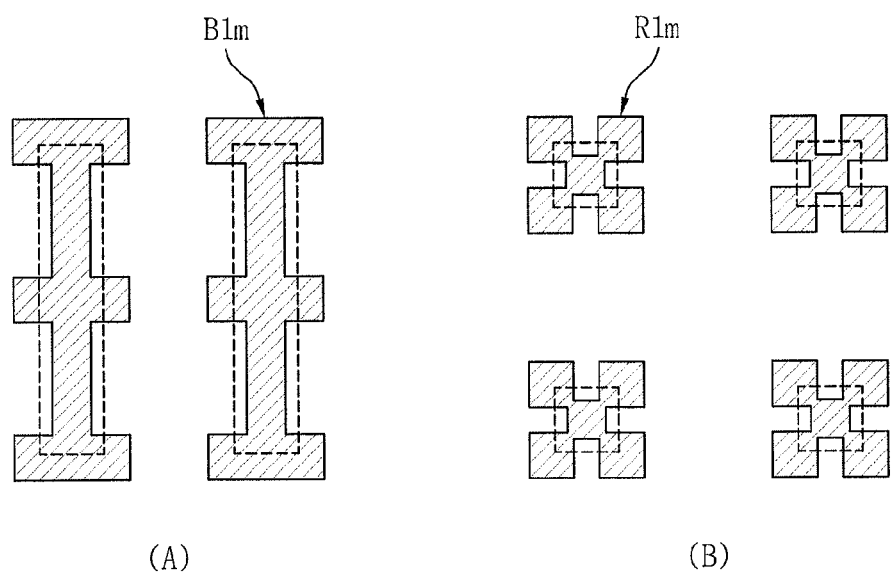

Referring to FIG. 12, the pattern design method according to the embodiment of the inventive concept may include extracting one chip area CA, e.g., an $m^{th}$ chip area Cm. Referring to FIGS. 12 and 13B, the pattern design method according to the embodiment of the inventive concept may include primarily correcting an initial layout 50A of the $m^{th}$ chip area Cm and forming a primary corrected layout 50Bm of the $m^{th}$ chip. In this embodiment, the primary corrected layout 50Bm of the $m^{th}$ chip area may include the correction for compensating for the long range effect.

Referring FIG. 12, the pattern design method according to the embodiment of the inventive concept may include deciding whether the primary correction is performed for the initial layouts 50A of all the chip areas C11 to C55. If the initial layouts 50A of all the chip areas C11 to C55 are not primarily corrected, the pattern design method may include primarily correcting the initial layouts 50A of an $(m+1)^{th}$ chip area Cm+1 by extracting the $(m+1)^{th}$ chip area Cm+1. If all the chip areas CA include the primary corrected layout 50B, the next step may proceed.

Figure 13C:
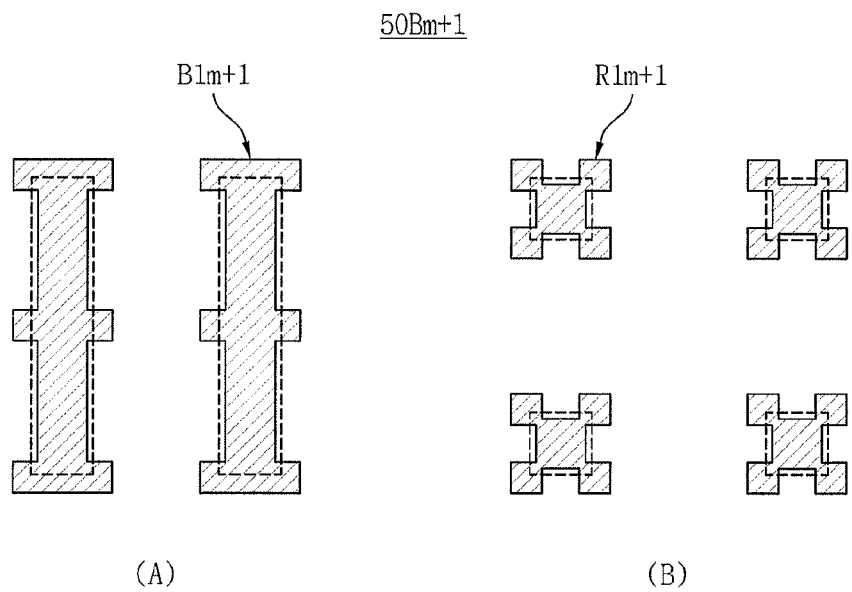

Referring to FIGS. 12 and 13C, the pattern design method according to the embodiment of the inventive concept may include primarily correcting the initial layout 50A of the $(m+1)^{th}$ chip area and forming a primary corrected layout 50Bm+1 of a $(m+1)^{th}$ chip. Referring to FIG. 13B again, it may be understood that the primary corrected layout 50Bm of the $m^{th}$ chip and the primary corrected layout 50Bm+1 of the $(m+1)^{th}$ chip are different from each other.

Figure 13D:
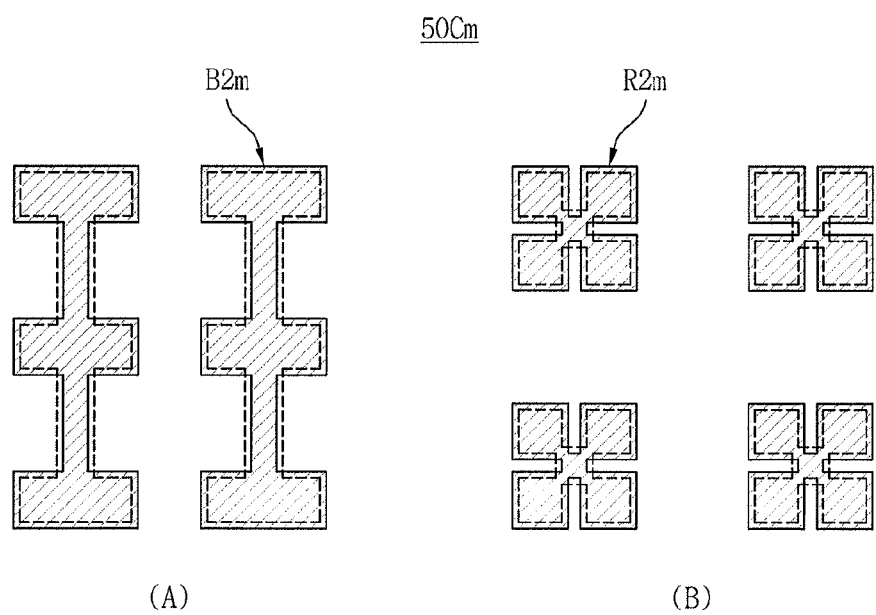
Figure 13E:
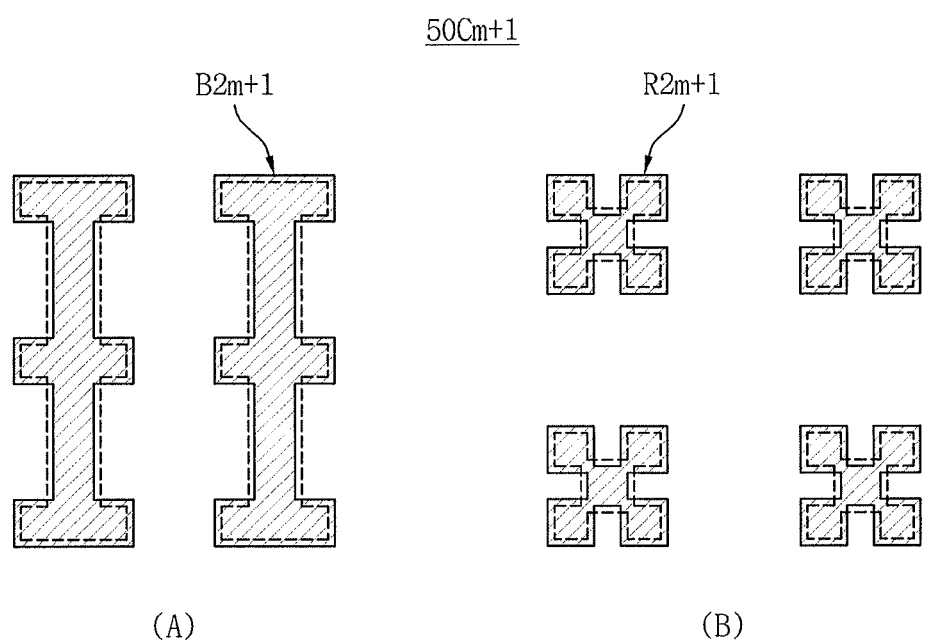

Referring to FIGS. 12, 13D and 13E, the pattern design method according to the embodiment of the inventive concept may include secondarily correcting the primary corrected layouts 50Bm and 50Bm+1 of all the chip areas C11 to C55 and forming secondary corrected layouts 50Cm and 50Cm+1. Accordingly, the secondary corrected layout 50Cm of the $m^{th}$ chip area Cm may be different from the secondary corrected layout 50Cm+1 of the secondarily corrected $(m+1)^{th}$ chip area Cm+1. The secondary correction may include the correction for compensating for the optical proximity effect. For example, the secondary correction may include applying the same correction value.

According to the inventive concept, since all the chip areas C11 to C55 included in one shot area SA can each be corrected independently, all the chip areas C11 to C55 can be accurately corrected to be suitable to characteristics of the respective chip areas CA. In addition, the primary correction and the secondary correction can be performed separately, such that the computing process for applying the total correction value can be simple. That is, since the number of times for computing the secondary correction value is reduced to one time, a total of computing processes may be shortened and simplified, e.g., a total of 1+m correction processes for all of the primary and secondary corrections. In addition, since a quantity of data which is also required for correcting in the primary correction may be reduced, time for computing the primary correction may also be shortened.

Figure 14:
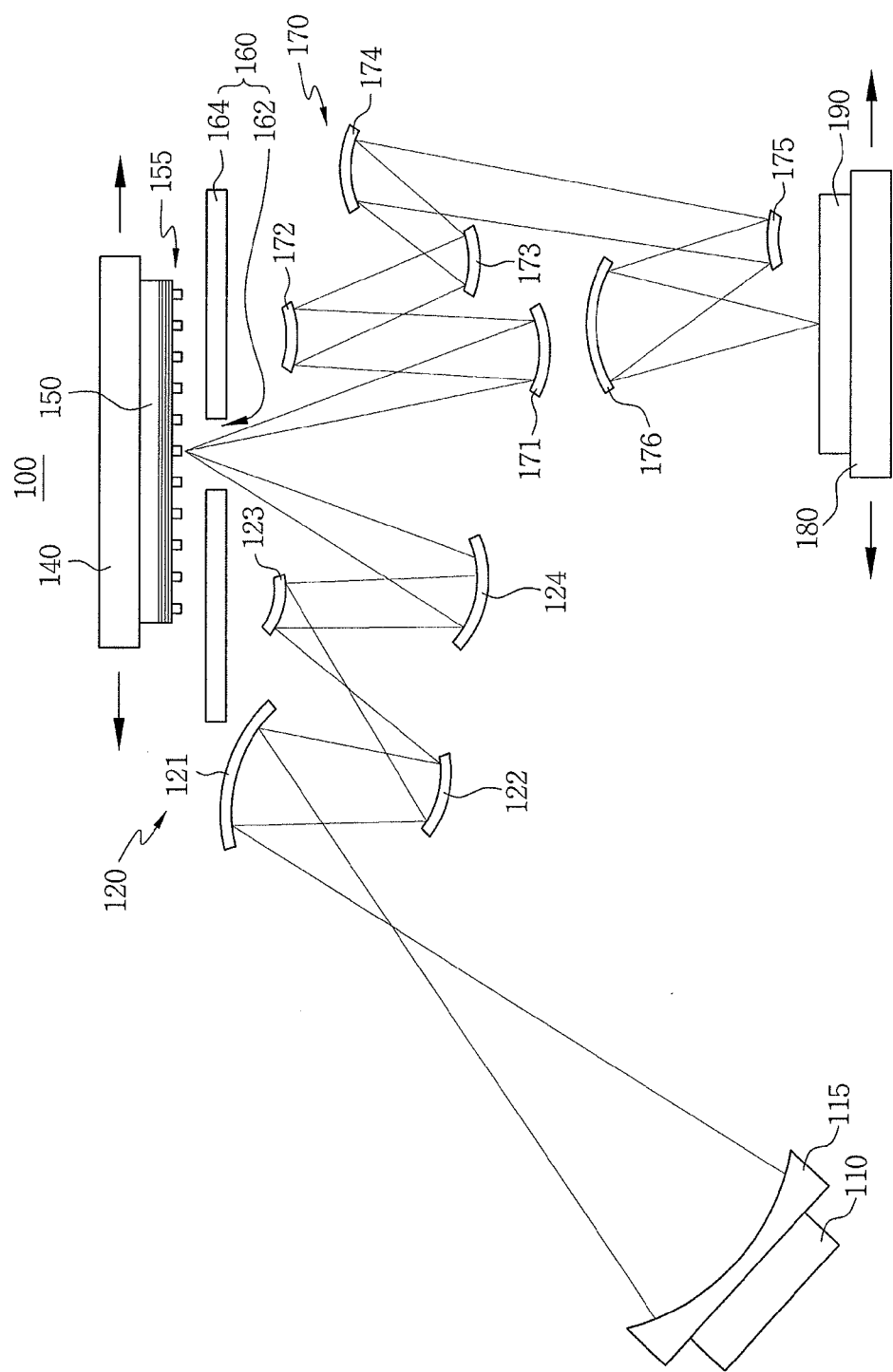
FIG. 14 is a view illustrating a photolithography process using a photomask having a final layout formed by various embodiments of the inventive concept.

FIG. 14 is a view illustrating a photolithography process using a photomask having a final layout formed by various embodiments of the inventive concept.

Referring to FIG. 14, a reflective photolithography process may be performed using a photomask including the final layout formed by one of the various embodiments of the inventive concept. A reflective photolithography apparatus 100 may include a light source 110, an illumination mirror system 120, a photomask stage 140, a blinder 160, a projection mirror system 170, and a wafer stage 180.

The light source 110 can generate extreme ultraviolet light (EUVL). For example, the light source 110 may be configured to generate light with a wavelength of approximately 13.5 nm, e.g., using carbon plasma. In addition, the light source 110 may include a collector 115. The collector 115 may collect the EUVL generated from the light source 110 and adjust the collected light to go straight in any one direction. For example, the EUVL generated from the light source 110 may be irradiated to the illumination mirror system 120 through the corrector 115.

The illumination mirror system 120 may include a plurality of illumination mirrors 121 to 124. The illumination mirrors 121 to 124 can condense the EUVL, e.g., in order to reduce loss of the EUVL, toward the outside of the mirrors. For example, the illumination mirrors 121 to 124 can uniformly adjust overall intensity distribution of the EUVL. Accordingly, the plurality of illumination mirrors 121 to 124 may include concave mirrors and/or convex mirrors in order to diversify the paths of the EUVL, respectively. In addition, the illumination mirror system 120 may form the EUVL to have, e.g., a square shape, a circular shape, a bar shape, and the like, and also transmit the EUVL to the photomask stage 140.

The photomask stage 140 may mount the reflective photomask 150 on a lower surface thereof and may move the reflective photomask 150 in the horizontal direction, e.g., along the arrows in the drawing. The photomask stage 140 may include an electrostatic chuck (ESC). The reflective photomask 150 may include optical patterns 155 on one surface of thereof. The reflective photomask 150 may be mounted on the photomask stage 140 or a lower surface of the ESC such that a surface being formed with the optical patterns 155 may face the bottom of the drawing. The optical patterns 155 may be generated from the initial layouts formed by one of embodiments of the inventive concept.

The blinder 160, e.g., a shutter, may be disposed at the lower portion of the photomask stage 140, e.g., the optical patterns 155 may face the blinder 160. The blinder 160 may include an exposure slit 162 and a blinder plate 164. The exposure slit 162 may have bar or stick shapes and form the shape of the EUVL to be transmitted from the illumination mirror system 120 to the reflective photomask 150 on the photomask stage 140. The EUVL transmitted from the illumination mirror system 120 may be irradiated to the reflective photomask 150 on the photomask stage 140 through the exposure slit 162. The EUVL reflected from the reflective photomask 150 on the photomask stage 140 may be transmitted to the projection mirror system 170 through the exposure slit 162. The blinder plate 164 can block the EUVL irradiated to areas other than the exposure slit 162. Accordingly, the blinder 160 can pass the EUVL through the exposure slit 162 and block a portion of the EUVL using the blinder plate 164.

The projection mirror system 170 may receive the EUVL that is reflected from the reflective photomask 150 and then passed through the exposure slit 162 and may transmit the received EUVL to the wafer 190. Also, the projection mirror system 170 may include a plurality of projection mirrors 171-176. The EUVL irradiated on the wafer 190 through the projection mirrors 171-176 may include virtual image information of the optical patterns 155 of the reflective photomask 150. The shape of the EUVL irradiated on the wafer 190 may have an original shape formed through the exposure slit 162. The plurality of projection mirrors 171-176 can correct various aberrations.

The wafer stage 180 can be moved in the horizontal direction, e.g., in an arrow direction in the drawing, while mounting the wafer 190. The wafer stage 180 can move at a constant speed ratio in the same direction as the photomask stage 140. For example, when the movement ratio is 5:1 (20%), the wafer stage 180 can move 2 μm in the same direction when the photomask stage 140 moves 10 μm in the right or left direction. Alternatively, when the movement ratio is 4:1 (25%), the wafer stage 180 can move 2.5 μm in the same direction when the photomask stage 140 moves 10 μm in the right or left direction. The movement ratio may be set variously. For example, the wafer stage 180 can move in a step and scan method. A focus of the EUVL irradiated from the projection mirror system 170 may be located above a surface of the wafer 190. For example, a photoresist layer may be formed to have a constant thickness on the wafer 190, and the focus of the EUVL may be located in the photoresist layer. In the drawing, the paths along which the EUVL progresses are conceptually shown in order to easily understand the inventive concept.

In the pattern design method according to embodiments of the inventive concept, since the correction of compensating for the optical proximity effect and the correction of compensating for the long range effect may each be corrected independently, layouts of final patterns which are more accurately corrected can be formed. Further, in the pattern design method according to other embodiments of the inventive concept, since the corrections of compensating for the optical proximity effect are performed only one time and the corrections of compensating for the long range effect are performed independently for each one of the chip areas, layouts of final patterns can be formed more quickly.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of designing a pattern layout, the method comprising:
   defining one shot area including a plurality of chip areas;
   generating an initial common layout in the plurality of chip areas;
   primarily correcting using a computer the initial layout to form a primary corrected layout; and
   secondarily correcting using the computer the primary corrected layout independently to form a plurality of secondary corrected layouts.

2. The method as claimed in claim 1, wherein each of the plurality of chip areas in the one shot area corresponds to one semiconductor chip.

3. The method as claimed in claim 1, wherein the one shot area is an area to be simultaneously exposed by performing a single scanning process in a photolithography process.

4. The method as claimed in claim 1, wherein the primary corrected layout is applied in common to the plurality of chip areas.

5. The method as claimed in claim 1, wherein primarily correcting the initial layout includes compensating for an optical proximity effect.

6. The method as claimed in claim 1, wherein secondarily correcting the primary corrected layout includes correcting each primary corrected layout independently so as to correspond to each chip area.

7. The method as claimed in claim 1, wherein secondarily correcting the primary corrected layout is repeated by a number of the respective chip areas.

8. The method as claimed in claim 1, wherein secondarily correcting the primary corrected layout includes compensating for a long range effect.

9. The method as claimed in claim 1, wherein each secondary corrected layout corresponds to each chip area of the plurality of chip independently.

10. The method as claimed in claim 1, further comprising forming a final layout by collecting the secondary corrected layouts corresponding to the plurality of chip areas.

11. The method as claimed in claim 1, wherein each secondary corrected layout is identical to a layout of an optical pattern to be formed on a photomask.

12. The method as claimed in claim 1, wherein the initial layout is identical to a layout of a physical pattern to be formed on a semiconductor wafer.

13. A method of designing pattern layouts, the method comprising:
   defining a shot area including a first chip area and a second chip area;
   generating an initial layout corresponding to the first chip area and the second chip area in common;
   forming using a computer a primary corrected layout corresponding in common to the first chip area and the second chip area by performing a primary correction, in which an optical proximity effect is compensated for, on the initial layout;
   forming using the computer a first secondary corrected layout corresponding to the first chip area by performing a first secondary correction, in which a correction value corresponding to the first chip area is applied, on the primary corrected layout; and
   forming using the computer a second secondary corrected layout corresponding to the second chip area by performing a second secondary correction, in which a correction value corresponding to the second chip area is applied, on the primary corrected layout.

14. The method as claimed in claim 13, wherein the first chip area is located at a center of the shot area, and the second chip area is located at a periphery of the shot area.

15. The method as claimed in claim 13, further comprising forming a final layout including a first secondary corrected layout and a second secondary corrected layout.

16. A method of designing a pattern layout, the method comprising:
   defining one shot area including a plurality of chip areas;
   generating an initial layout in the plurality of chip areas, such that the initial layout is common to the plurality of chip areas;
   primarily correcting using a computer the initial layout via a single correcting process to form a primary corrected layout, such that the primary corrected layout is common to the plurality of chip areas; and secondarily correcting using the computer the primary corrected layout to form an independent secondary corrected layout for each one of the plurality of chip areas.

17. The method as claimed in claim 16, wherein secondarily correcting the primary corrected layout includes a plurality of correcting process, a total number of correcting processes for the primarily correcting and secondarily correcting is n+1, where n is a total number of the plurality of chip areas.

18. The method as claimed in claim 16, wherein primarily correcting the initial layout includes correcting all the chip areas identically.

19. The method as claimed in claim 18, wherein secondarily correcting the primary corrected layout includes correcting each primarily corrected chip areas independently of other chip areas.

* * * * *